United States Patent
Hardy et al.

(10) Patent No.: US 6,876,199 B2
(45) Date of Patent: Apr. 5, 2005

(54) METHOD AND SYSTEM FOR ACCELERATED IMAGING USING PARALLEL MRI

(75) Inventors: Christopher Judson Hardy, Schenectady, NY (US); Charles Lucian Dumoulin, Ballston Lake, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 10/452,095

(22) Filed: May 30, 2003

(65) Prior Publication Data

US 2004/0239324 A1 Dec. 2, 2004

(51) Int. Cl.[7] ................................................ G01V 3/00
(52) U.S. Cl. ........................................ 324/309; 324/307
(58) Field of Search ................................ 324/300, 307, 324/309, 311, 318, 322; 600/410, 422; 333/219

(56) References Cited

U.S. PATENT DOCUMENTS

| | | | | |
|---|---|---|---|---|
| 4,712,067 A | * | 12/1987 | Roschmann et al. | 324/318 |
| 5,138,260 A | * | 8/1992 | Molyneaux et al. | 324/309 |
| 5,198,768 A | * | 3/1993 | Keren | 324/318 |
| 5,477,146 A | * | 12/1995 | Jones | 324/318 |
| 5,910,728 A | | 6/1999 | Sodickson | 324/309 |
| 6,137,291 A | * | 10/2000 | Szumowski et al. | 324/318 |
| 6,289,232 B1 | * | 9/2001 | Jakob et al. | 600/410 |
| 6,323,648 B1 | * | 11/2001 | Belt et al. | 324/322 |
| 6,326,789 B1 | * | 12/2001 | Yoshida et al. | 324/318 |
| 6,366,092 B1 | * | 4/2002 | Ehnholm et al. | 324/309 |
| 6,396,269 B1 | * | 5/2002 | Hajnal et al. | 324/307 |
| 6,441,615 B1 | * | 8/2002 | Fujita et al. | 324/318 |
| 6,556,009 B2 | * | 4/2003 | Kellman et al. | 324/309 |
| 6,593,741 B2 | * | 7/2003 | Bydder et al. | 324/307 |
| 6,608,480 B1 | * | 8/2003 | Weyers | 324/318 |
| 6,633,161 B1 | * | 10/2003 | Vaughan, Jr. | 324/318 |
| 6,680,610 B1 | * | 1/2004 | Kyriakos et al. | 324/307 |
| 6,701,177 B2 | * | 3/2004 | Su | 600/422 |
| 2004/0051529 A1 | * | 3/2004 | Zhu et al. | 324/318 |

OTHER PUBLICATIONS

Klaas P. Pruessmann, Markus Weiger, Markus B. Scheidegger, and Peter Boesiger, "SENSE: Sensitivity Encoding for Fast MRI", *Magnetic Resonance in Medicine* 42:952–962 (1999).

* cited by examiner

Primary Examiner—Brij Shrivastav
Assistant Examiner—Dixomara Vargas
(74) Attorney, Agent, or Firm—Jean K. Testa; Patrick K. Patnode

(57) ABSTRACT

A method of and system for parallel imaging using a Magnetic Resonance Imaging (MRI) system is provided. The method comprises acquiring a plurality of magnetic resonance (MR) signals from a receiver coil array placed about a subject in the MRI system, where the receiver coil array has a plurality of receiver elements arranged in rows and, during application of a readout gradient in a frequency encoding direction, shifting receiver frequencies by a selectable amount for each row of the array in order to shift a limited field of view (FOV) in the frequency encoding direction.

20 Claims, 3 Drawing Sheets

METHOD AND SYSTEM FOR ACCELERATED IMAGING USING PARALLEL MRI

STATEMENT REGARDING FEDERALLY SPONSORED RESEARCH & DEVELOPMENT

The U.S. Government may have certain rights in this invention pursuant to grant RO1 RR15396-01A1 awarded by the National Institutes of Health (NIH).

BACKGROUND OF THE INVENTION

The invention relates generally to Magnetic Resonance Imaging (MRI) systems and more specifically to a method and apparatus for parallel imaging in the frequency-encoding direction using MRI systems.

MRI is a well-known imaging technique. A conventional MRI device establishes a homogenous magnetic field, for example, along an axis of a person's body that is to undergo MRI. This homogeneous magnetic field conditions the interior of the person's body for imaging by aligning the nuclear spins (in atoms and molecules forming the body tissue) along the axis of the magnetic field. If the orientation of the nuclear spins is perturbed out of alignment with the magnetic field, the nuclei attempt to realign their spins with the axis of the magnetic field. Perturbation of the orientation of nuclear spins may be caused by application of radio frequency (RF) pulses tuned to the armor frequency. During the realignment process, the nuclei precess about the axis of the magnetic field and emit electromagnetic signals that may be detected by one or more RF detector coils placed on or about the person.

The frequency of the magnetic resonance (MR) signal emitted by a given processing nucleus depends on the strength of the magnetic field at the nucleus' location. As is well known in the art, it is possible to distinguish signals originating from different locations within the person's body by applying a gradient to the magnetic field across the person's body. For the sake of convenience, direction of this field gradient may be referred to as the left-to-right direction. Signals of a particular frequency acquired during application of the field gradient may be assumed to originate at a given position within the field gradient, and hence at a given left-to-right position within the person's body. The application of such a field gradient is also referred to as frequency encoding.

However, the application of a field gradient does not allow for two-dimensional spatial encoding, since all nuclei at a given left-to-right position experience the same field strength, and hence emit signals of the same frequency. Accordingly, the application of a frequency-encoding gradient, by itself, does not make it possible to discern signals originating from the top versus signals originating from the bottom of the person at a given left-to-right position. Spatial encoding has been found to be possible in this second direction by application of gradients of varied strength in a perpendicular direction prior to acquisition of the signal, to thereby twist the phase of the nuclear spins by varied amounts. The application of such additional gradients is referred to as phase encoding.

Frequency-encoded data sensed by the RF detector coils after a phase encoding step are stored as a line of data in a data matrix known as the k-space matrix. Multiple phase encoding steps are performed in order to fill the multiple lines of the k-space matrix. An image may be generated from this matrix by performing a two-dimensional Fourier transformation of the matrix to convert this frequency information to spatial information representing the distribution of nuclear spins or density of nuclei of the image material.

Alternatively, spatial encoding can be performed in three dimensions by applying phase-encoding gradients in two orthogonal directions, followed by a frequency-encoding gradient in the third orthogonal direction, with signals acquired during the frequency-encoding gradient, in order to generate a three-dimensional matrix of k-space data. Three-dimensional Fourier transformation of the matrix will then convert this frequency information to spatial information representing the distribution of nuclear spins or density of nuclei within a volume of the image material.

Imaging time is largely a factor of desired signal-to-noise ratio (SNR) and the speed with which the MRI device can fill the k-space matrix. In conventional MRI, the k-space matrix is filled one line at a time. Although many improvements have been made in this general area, the speed with which the k-space matrix may be filled is limited. To overcome these inherent limits, several techniques have been developed to effectively simultaneously acquire multiple lines of data for each application of a magnetic field gradient. These techniques, which may collectively be characterized as "parallel imaging techniques", use spatial information from arrays of RF detector coils to substitute for the encoding which would otherwise have to be obtained in a sequential fashion using field gradients and RF pulses. The use of multiple effective detectors has been shown to multiply imaging speed, without increasing gradient switching rates or RF power deposition.

Parallel imaging techniques fall into one of two categories. They can fill in the omitted k-space lines prior to Fourier transformation, by constructing a weighted combination of neighboring lines acquired by the different RF detector coils. Or, they can first Fourier transform the limited k-space data to produce an aliased image from each coil, and then unfold the aliased signals by a linear transformation of the superimposed pixel values. In either case, the reconstructed images tend to suffer from incomplete removal of aliasing artifacts, especially for large speedup factors. In images corrupted by aliasing, the edges of the image are wrapped into the center of the image.

Two such parallel imaging techniques that have recently been developed and applied to in vivo imaging are SENSE (SENSitivity Encoding) and SMASH (simultaneous acquisition of spatial harmonics). Both techniques include the parallel use of a plurality of separate receiving elements, with each element having a different respective sensitivity profile, and combination of the respective spin resonance signals detected enables a reduction of the acquisition time required for an image (in comparison with conventional Fourier image reconstruction) by a factor which in the most favorable case equals the number of the receiving members used (see Pruessmann et al., *Magnetic Resonance in Medicine* Vol. 42, p.952–962, 1999).

For pulse sequences that execute a rectilinear trajectory in k space, parallel imaging techniques invariably reduce the number of phase encoding steps in order to reduce imaging time, and then use array sensitivity information to make up for the loss of spatial information. For some pulse sequences, such as single-shot fast spin echo, substantial reductions in imaging time could also be realized if the number of points in the frequency-encoding direction could be reduced without sacrificing spatial resolution or field of view (FOV). Receiver filtering cuts off the signals outside the readout band, unlike in the phase-encoding direction, where such signals are aliased back into the FOV, where they can be unwrapped by parallel image reconstruction.

Multi-coil MR imaging utilizes a greater number of receiving channels. Raising the number of channels in multi-coil imaging beyond the typical 4 to 8 can potentially yield a wide variety of benefits, including improved signal-to-noise-ratio (SNR), larger field of views (FOV) and/or faster imaging speeds. These benefits may have important applications in overcoming cardiac, respiratory, and peristaltic motion during body imaging, and for delivering and monitoring therapy under MRI guidance. A method and system are needed for performing accelerated parallel imaging using MRI.

BRIEF SUMMARY OF THE INVENTION

Briefly, in accordance with one embodiment of the invention, a method of parallel imaging using a Magnetic Resonance Imaging (MRI) system comprises acquiring a plurality of magnetic resonance (MR) signals from a receiver coil array placed about a subject in the MRI system where the receiver coil array has a plurality of receiver elements arranged in rows and, during application of a readout gradient in a frequency encoding direction, shifting receiver frequencies by a selectable amount for each row of the array in order to shift a field of view (FOV) in the frequency encoding direction.

In accordance with another embodiment of the invention, a system for parallel imaging using Magnetic Resonance Imaging (MRI) comprises at least one receiver coil array assembly positioned about a region of interest to be imaged for use in acquiring magnetic resonance (MR) signals, the array having a plurality of receiver elements arranged in rows to form an array, a pulse control module for applying a selected pulse sequence, and, an image processor for acquiring a plurality of the MR signals from each of the receiver elements and the image processor being further configured for shifting respective receiver frequencies in a selected frequency encoding direction by a selectable amount for each row of the array in order to shift a field of view (FOV) in the frequency encoding direction.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION OF THE INVENTION

Figure 1:
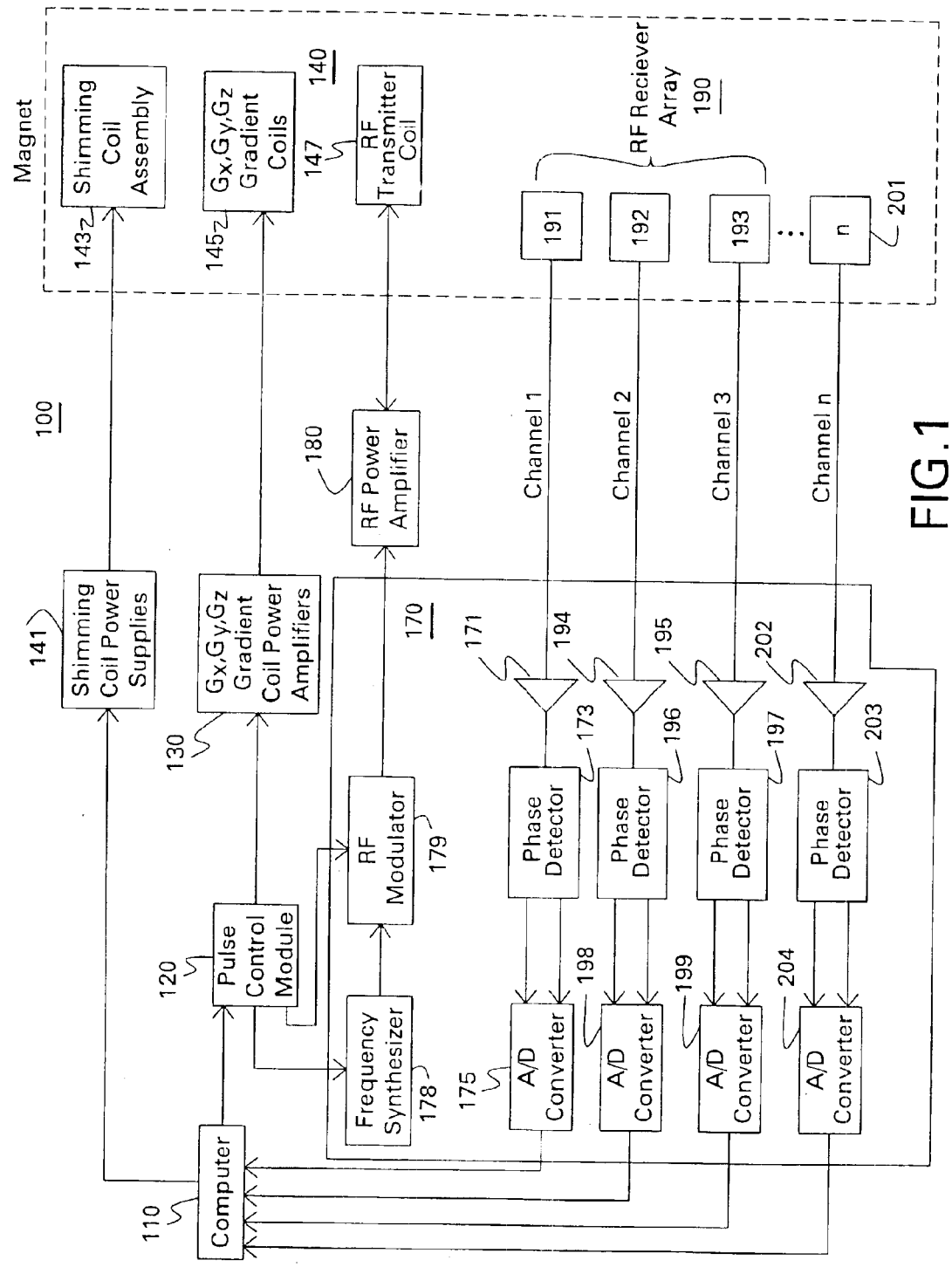
FIG. 1 is a schematic block diagram of an exemplary MR imaging system suitable for use with the present invention embodiments.

FIG. 1 is an exemplary embodiment of a magnetic resonance imaging (MRI) system 100. MRI system 100 includes a computer 110, which controls gradient coil power amplifiers 130 through a pulse control module 120. The pulse control module 120 and the gradient amplifiers 130 together produce the proper gradient waveforms Gx, Gy, and Gz, for either a spin echo, a gradient recalled echo pulse sequence, a fast spin echo, or other type of well-known pulse sequences. The gradient waveforms are connected to gradient coils 145, which are positioned around the bore of an MR magnet assembly 140 so that gradients Gx, Gy, and Gz are impressed along their respective axes on the polarizing magnetic field $B_0$ from magnet assembly 140.

The pulse control module 120 also controls a radio frequency (RF) synthesizer 178 that is part of RF transceiver system 170, portions of which are enclosed by bold line block. The pulse control module 120 also controls an RF modulator 179, which modulates the output of the radio frequency synthesizer 178. The resultant RF signals, amplified by RF power amplifier 180 and applied to a RF transmitter coil 147, are used to excite the nuclear spins of the imaged object (not shown).

As part of the image acquisition process, the MR signals from the excited nuclei of the imaged object are picked up by RF receiver coil 191 and presented to preamplifier 171, to be amplified and then processed by a quadrature phase detector 173. The detected signals are digitized by a high speed A/D converter 175 and applied to computer 110 for processing to produce MR images of the object. Computer 110 also controls shimming coil power supplies 141 to power shimming coil assembly 143. The manner in which computer 110 processes the detected signal to reconstruct an image is described in further detail below.

In embodiments of the present invention, MRI system 100 further comprises RF receiver array 190 which is an RF detector array consisting of multiple detector elements 191, 192, 193 (for example, but could include more elements represented as n elements shown as 201), such as loops or conductive strips and may also be configured as an array of multiple coils or conductive strips. Other conductive materials and structures, for example copper rods, pipes, wires or other similar line structures, may also be used as detector elements. An exemplary embodiment of a RF receiver array 190 will be described in greater detail with reference to FIGS. 2 and 3.

In a further embodiment, a method of parallel imaging using a Magnetic Resonance Imaging (MRI) system comprises acquiring magnetic resonance (MR) signals from a parallel receiver array with variable frequency shifts for respective receiver elements of the receiver array, the parallel receiver array having a substantial number of receiver elements n of about 8 to about 32. The method further comprises reconstructing the MR signals into an image.

Figure 2:
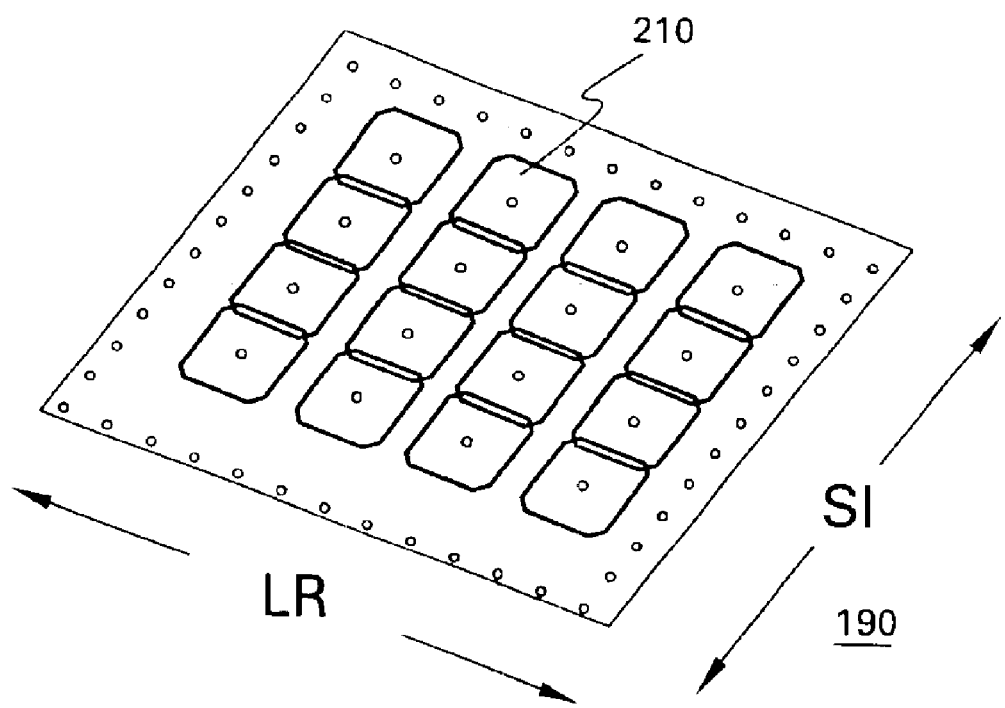
FIG. 2 is a planar view of an exemplary embodiment of a parallel imaging array to which embodiments of the present invention are applicable; and, FIG. 3 is an illustration of a parallel imaging array positioned about a subject for placement in a MRI system.
Figure 3:
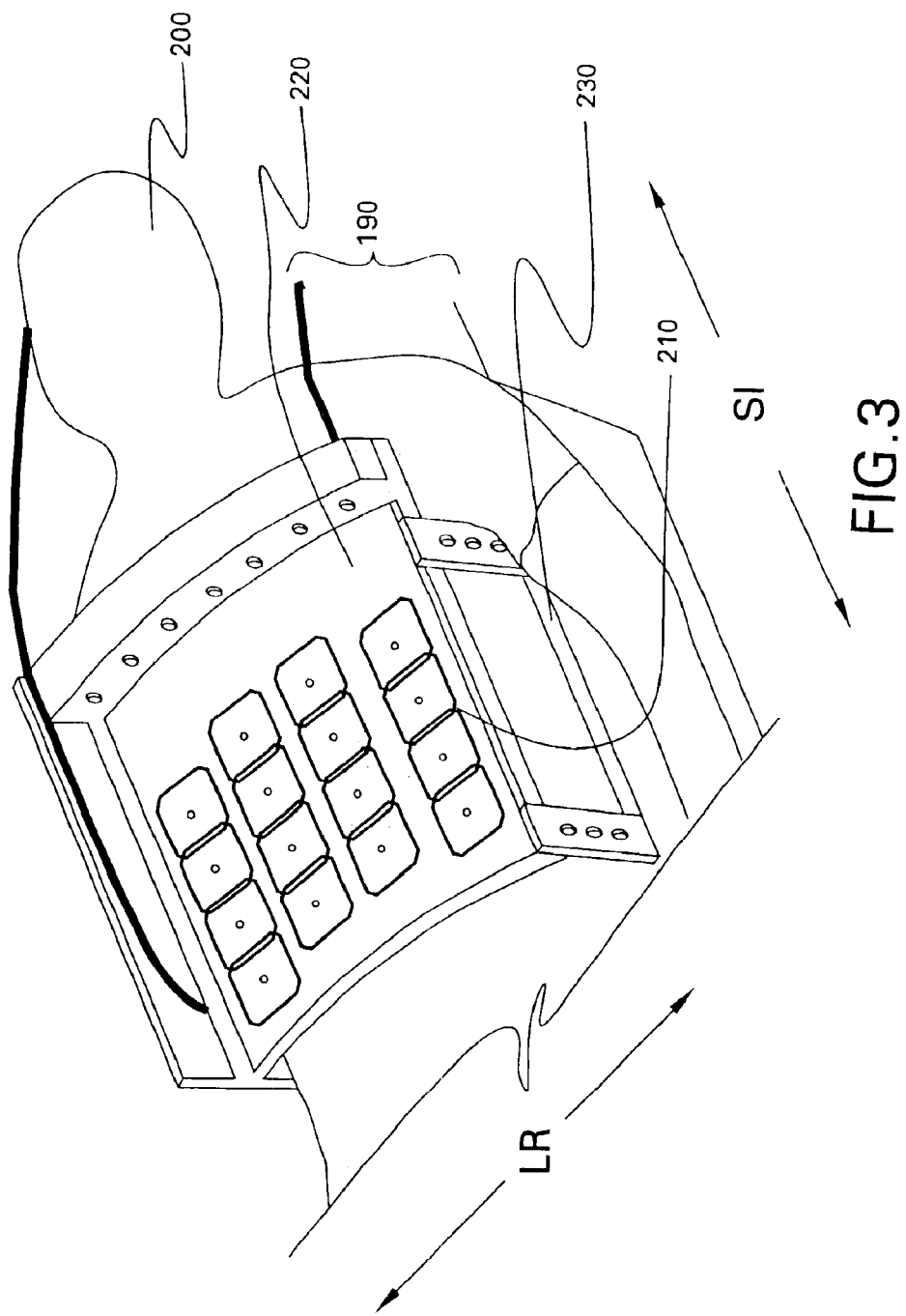

Referring to FIG. 2, a planar view of an exemplary embodiment of RF receiver array 190 is shown. In this embodiment, RF receiver array 190 is constructed with a 4 rows of 4 coils or receiver elements 210 aligned in the left/right (LR) and superior/inferior (SI) directions, as shown in FIG. 2. In this embodiment, there is a 4×4 array to be positioned below the subject (posterior sub-assembly) and another identical assembly above (anterior sub-assembly, only one is shown), for a total of 32 elements. The 32 coils or elements enable parallel imaging with 32 available receiver channels As used herein, an element is one detector coil in the RF receiver array 190 each small loop 210 in FIG. 2. Referring again to FIG. 1, a channel as used herein is the entire chain running from that array element (191, 192, 193, . . . 201) through the preamplifier (171, 194, 195, . . . 202), phase-sensitive detector (173, 196, 197 . . . 203), and A/D converter (175, 198, 199 . . . 204). Multiple coil imaging is particularly helpful in overcoming motion, e.g. cardiac, respiratory or peristaltic, during body imaging. Additionally, multiple coil imaging has applications in delivery and monitoring therapy during MRI. In the embodiment shown in FIG. 2, a 32-channel parallel imaging array suitable for torso imaging is shown and is comprised of 4 rows of 4 coils (each 79 mm×105 mm) built on identical clamshell formers (one shown in FIG. 2). Coils were spaced by 16 mm in the right/left direction and overlapped by 18 mm in the superior/inferior direction) to provide optimal signal-to-noise-ratio (SNR) for parallel imaging. For torso imaging, the clamshell formers are positioned about a subject's torso on a patient table of the MRI system. Referring to FIG. 3, there is shown a subject 200 with the RF receiver array 190 in position about the subject's torso (anterior sub-assembly 220, posterior sub-assembly 230).

Using this exemplary embodiment of RF receiver array 190, it is possible to perform real-time, large field of view (FOV) parallel imaging. In an embodiment, a method of parallel imaging using a Magnetic Resonance Imaging (MRI) system comprises acquiring a plurality of magnetic resonance (MR) signals from a receiver coil array placed about a subject in the MRI system, the receiver coil array has a plurality of receiver elements arranged in rows and, during application of a readout gradient in a frequency encoding direction, shifting receiver frequencies by a selectable amount for each row of the array in order to shift a field of view (FOV) in the frequency encoding direction.

The image acquisition uses a pulse sequence configured for imaging a volume and for shortening image acquisition time. As used herein, "adapted to", "configured" and the like refer to mechanical or structural connections between elements to allow the elements to cooperate to provide a described effect; these terms also refer to operation capabilities of electrical elements such as analog or digital computers or application specific devices (such as an application specific integrated circuit (ASIC)) that are programmed to perform a sequel to provide an output in response to given input signals. For example, in an exemplary embodiment, real-time imaging was performed with the use of an interleaved echo-planar pulse sequence. In addition, a large-FOV body-survey mode was developed, which employed a repeated single-shot fast-spin-echo (SSFSE) sequence to generate 0.5–1 sec images at a rate of 1–2 per sec. To expand the FOV for coronal imaging and other applications while maintaining image resolution and high frame rates, the readout gradient was oriented in the S/I direction, and limited-FOV images were acquired. Different FOV shifts were applied during image acquisition to each pair of L/R rows of coils (one row on the anterior clamshell and the other directly opposite on the posterior clamshell), so that the FOV was centered directly under that row of coils. Parallel encoding was applied in the L/R direction, with a speedup factor typically of 2–3. The pulse sequence provided herein was particularly useful for cardiac imaging and other regions of interest in the torso area. It is to be appreciated that one skilled in the art may select from various known pulse sequences to expand the FOV and achieve the read-out rates depending on the region to be imaged and frame rate needed. Computer 110 (FIG. 1) is configured for various image-processing algorithms. For example, computer 110 would be configured to phase unwrap aliasing in a phase-encoding direction resulting from any reduced field of view in the phase encoding direction. Further, computer 110 is configured to reconstruct an image by generating sub-images from the MR signals acquired for each row of the array and combining the sub-images. In an embodiment, the combining step is done by shifting each sub-image by an amount equal to the FOV shift, which was applied during image acquisition, and taking the square root of the sum of the square of image intensities in overlapped regions of the images.

Consider the case of coronal imaging, where the frequency-encoding direction is superior/inferior (S/I) and the phase-encoding direction is left/right (L/R). In this technique, the signals collected by each L/R row of coils have their receiver frequencies offset by an appropriate amount in order to shift the FOV in the superior/inferior direction, so that it is centered directly under (or over) that row of coils. Varying receiver frequencies independently for different coils is not possible on most commercial scanners, but is possible on a custom 32-channel Signa™ from General Electric. In the exemplary embodiment shown in FIG. 1, each phase-sensitive detector (e.g. 173, 196, 197 . . . 204) incorporates a different frequency source (e.g. f1, f2, f3, etc) for demodulating the NMR signal from the respective preamplifiers (e.g. 171, 194, 195, . . . 203)). In accordance with this exemplary embodiment, fast spin echo images of the torso were acquired with the coils of FIG. 2, with variable FOV shifts applied as described above. Images were generated from a composite from each L/R row of the array. By shrinking the FOV in the frequency-encoding direction, the imaging time was substantially reduced without sacrificing spatial resolution. Note that with the FOV also made small in the phase-encoding direction, aliasing is created in that direction. This aliasing is unwrapped using standard parallel MRI techniques, such as SENSE and SMASH. The composite images were combined from each L/R row by shifting each composite image by the appropriate amount and taking the square root-of-the-sum-of-the-squares in the overlapped regions of the images to generate a final image. Thus, it is to be appreciated that by using a parallel-imaging array according to embodiments of the invention provides the ability to achieve speedups in both the phase-encoding and frequency-encoding directions without sacrificing resolution or FOV. Image acquisition acceleration in three dimensions is also possible with the techniques described herein, when used in conjunction with a 3D imaging sequence. In this 3D embodiment, the number of phase encoding steps can be reduced in both phase encoding directions, to produce acceleration in those two dimensions, and a reduced FOV with variable shifts is employed in the frequency-encoding direction. Then a 2D SENSE or SMASH reconstruction technique is employed for the two phase encoding dimensions and the resulting sub-images shifted in the frequency-encoding direction and combined.

While only certain features of the invention have been illustrated and described herein, many modifications and changes will occur to those skilled in the art. It is therefore to be understood that the appended claims are intended to cover all such modifications and changes as fall within the true spirit of the invention.

What is claimed is:

1. A method of parallel imaging using a Magnetic Resonance Imaging (MRI) system comprising:
    acquiring a plurality of magnetic resonance (MR) signals from a receiver coil array placed about a subject in the MRI system, the receiver coil array having a plurality of receiver elements arranged in rows; and,
    shifting receiver frequencies in a frequency encoding direction by a selectable amount for each row of the array in order to shift a field of view (FOV) in the frequency encoding direction.

2. The method of claim 1 wherein the selectable amount is variable for each row and is set to position each FOV directly under the corresponding row of receiver elements.

3. The method of claim 1 wherein the acquiring step employs a pulse sequence configured for imaging a volume and for shortening image acquisition time.

4. The method of claim 2 further comprising phase unwrapping to phase unwrap aliasing in a phase-encoding direction resulting from any reduced field of view in the phase encoding direction.

5. The method of claim 1 further comprising generating sub-images from the MR signals acquired for each row of the array and combining the sub-images.

6. The method of claim 5 wherein the combining step comprises:
   shifting each sub-image by an amount which is the same as the shift in FOV during image acquisition; and,
   taking the square root of the sum of the square in overlapped regions of the images.

7. The method of claim 1 wherein the array comprises multiple receiver channels.

8. The method of claim 7 wherein the MRI system is adapted to collect MR signal data from each of the channels.

9. The method of claim 1 wherein the array is a 32-coil array.

10. A system for parallel imaging using Magnetic Resonance Imaging (MRI) comprising:
    at least one receiver coil array assembly positioned about a region of interest to be imaged for use in acquiring magnetic resonance (MR) signals, the array having a plurality of receiver elements arranged in rows to form an array;
    a pulse control module for applying a selected pulse sequence; and,
    an image processor for acquiring a plurality of the MR signals from each of the receiver elements and the image processor being further configured for shifting respective receiver frequencies in a selected frequency encoding direction by a selectable amount for row of the array in order to shift a field of view (FOV) in the frequency encoding direction.

11. The system of claim 10 wherein the receiver coil array comprises multiple receiver channels.

12. The system of claim 11 wherein the image processor is adapted to collect MR signal data from each of the channels.

13. The system of claim 10 wherein the array is a 32-coil array.

14. The system of claim 10 wherein the image processor is configured for phase unwrapping aliasing in a phase-encoding direction resulting from a reduced field of view in the frequency encoding direction.

15. The system of claim 10 wherein the image processor is further configured for generating sub-images from the MR signals acquired for each row of the array and combining the sub-images.

16. The system of claim 15 wherein the combining comprises:
    shifting each sub-image by an amount which is the same as the shift in FOV during image acquisition; and,
    taking the square root of the sum of the square in overlapped regions of the images.

17. The system of claim 10 wherein the receiver coil array comprises an anterior sub-assembly and a posterior sub-assembly, the anterior and posterior sub-assemblies each comprising multiple receiver elements arranged in rows to acquire MR signals, and the anterior and posterior sub-assemblies adapted to be placed adjacent to the region of interest during imaging.

18. The system of claim 10 wherein the pulse sequence is adapted for imaging a volume and for shortening image acquisition time.

19. A method of parallel imaging using a Magnetic Resonance Imaging (MRI) system comprising:
    acquiring magnetic resonance (MR) signals from a parallel receiver array with variable frequency shifts for respective receiver elements of the receiver array, the parallel receiver array having a substantial number of receiver elements of about 8 to about 32.

20. The method of claim 19 further comprising the step of reconstructing an image.

* * * * *